United States Patent [19]

Eigler

[11] Patent Number: 5,166,919
[45] Date of Patent: Nov. 24, 1992

[54] ATOMIC SCALE ELECTRONIC SWITCH

[75] Inventor: Donald M. Eigler, Santa Cruz, Calif.

[73] Assignee: International Business Machines Corporation, Armonk, N.Y.

[21] Appl. No.: 728,447

[22] Filed: Jul. 11, 1991

[51] Int. Cl.$^5$ ............... H01J 37/30; G11B 9/00; G11C 13/00
[52] U.S. Cl. ................... 369/126; 365/151; 365/118; 307/125; 307/127; 250/306; 250/492.3
[58] Field of Search ............... 369/126, 101; 365/151, 365/174, 118, 128, 152, 78, 237; 250/492.3, 306, 309, 311, 492.2; 346/1.1; 307/112, 127, 138, 125

[56] References Cited

U.S. PATENT DOCUMENTS

| | | | |
|---|---|---|---|
| 3,668,106 | 6/1972 | Ota | 204/299 |
| 3,761,895 | 9/1973 | Ellis et al. | 340/173 CR |
| 3,886,530 | 5/1975 | Huber et al. | 340/173 CR |
| 4,032,901 | 6/1977 | Levinthal | 340/173 NC |
| 4,106,107 | 8/1978 | Goodman | 365/191 |
| 4,133,047 | 1/1979 | Levinthal | 365/118 |
| 4,573,006 | 2/1986 | Newton | 307/127 X |
| 4,575,822 | 3/1986 | Quate | 365/151 X |
| 4,631,704 | 12/1986 | Lucas et al. | 365/126 |
| 4,670,291 | 6/1987 | Mori et al. | 427/35 |
| 4,737,897 | 4/1988 | Shipley et al. | 307/127 X |
| 4,763,017 | 8/1988 | Campbell et al. | 307/127 X |
| 4,785,189 | 11/1988 | Wells | 250/492.2 |
| 4,792,702 | 12/1988 | Masaki | 307/127 X |
| 4,825,408 | 4/1989 | Potember et al. | 365/113 |
| 4,826,732 | 5/1989 | Kazan et al. | 369/126 X |
| 4,829,507 | 5/1989 | Kazan et al. | 369/126 |
| 4,878,213 | 10/1989 | Kazan et al. | 369/126 |
| 4,907,195 | 3/1990 | Kazan et al. | 365/151 X |
| 4,916,688 | 4/1990 | Foster et al. | 365/113 X |
| 4,929,489 | 5/1990 | Dreschhoff et al. | 428/195 |
| 4,962,480 | 10/1990 | Ooumi et al. | 365/151 |
| 4,987,312 | 1/1991 | Eigler | 369/101 X |
| 5,015,323 | 5/1991 | Gallagher | 156/345 |
| 5,051,970 | 9/1991 | Ishii et al. | 369/13 |

FOREIGN PATENT DOCUMENTS

| | | | |
|---|---|---|---|
| 0050644 | 3/1985 | Japan | 369/126 |
| 0116941 | 5/1989 | Japan | 365/151 |
| 311847 | 6/1989 | Japan . | |

OTHER PUBLICATIONS

Positioning Single Atoms with a Scanning Tunnelling Microscope, vol. 344, No. 6266, pp. 524–526, Apr. 5, 1990, Nature, 1990.

D. M. Eigler and E. K. Schweizer, IBM Research Division, Almaden Research Center, 650 Harry Rd., San Jose, Calif. 95120-6099, USA, Apr. 1990.

IBM Technical Disclosure Bulletin, vol. 32, No. 2, Jul. 1989, A. Aviram, P. Chaudhari, R. Feenstra, M. Pomerantz and P. E. Seiden, "Information Storage with Scanning Tunneling Microscope".

Aviram, Technical Disclosure Bulletin, pp. 444–450, "Molecular Electronic Circuit Device", Feb. 1989.

Brodsky, Technical Disclosure Bulletin, pp. 1374–1375, "Switching and Memory Filaments for Use with Amporphous Semiconductors", Oct. 1970.

Primary Examiner—Stuart S. Levy
Assistant Examiner—Joseph A. Rhoa
Attorney, Agent, or Firm—Robert B. Martin

[57] ABSTRACT

The present invention relate to an atomic scale electronic switch wherein the position of one or more atoms (12, 20) or molecules is varied to control the state of the switch. Terminals (10, 11, 21-23) may be tips of scanning tunneling microscopes or STMs. A change in position of the switch will result in a change in conductance between the spaced apart terminals. Voltage or current pulses cause the switching element (12) to change positions.

17 Claims, 5 Drawing Sheets

ATOMIC SCALE ELECTRONIC SWITCH

FIELD OF THE INVENTION

The present invention provides an atomic scale electronic switch and, more particularly, an electronic switch wherein the position of one or more atoms or molecules is varied to control the state of the switch.

BACKGROUND OF THE INVENTION

There is a continuing desire in the computer industry to increase the storage density of computer memory and build smaller electronic components for computers. Kazan et al., U.S. Pat. No. 4,826,732 issued May 2, 1989, discloses using a scanning tunneling microscope ("STM") to selectively remove or deposit a plurality of absorbate atomic particles from an absorbent carrier surface in an orderly fashion to record information. The STM can then be scanned over the same area again to readout the recorded information.

Eigler U.S. Pat. No. 4,987,312, issued Jan. 22, 1991, discloses moving an atom or molecule from one position on a substrate to another position on the substrate to record information and also repositioning atoms or molecules to fabricate a multi-atom structure. Copending application Ser. No. 07/569270, filed Aug. 17, 1990 is a CIP of and extends the teachings of this Eigler patent.

Foster et al., U.S. Pat. No. 4,916,688 issued Apr. 10, 1990 discloses reversibly changing selected areas of a data recording medium between amorphous and crystalline states with an STM to change the electronic properties of the medium at these areas.

Ooumi et al., U.S. Pat. Nos. 4,962,480 and 4,945,515, issued Oct. 9, 1990 and Jul. 31, 1990 respectively, disclose a memory device which involves writing on an atomic scale with an STM and then reading with the STM.

Although these techniques are useful, there still is a continuing need in the computer art for decreasing the size of computer electronic components and increasing the storage density of computer memory. The present invention provides an atomic scale electronic switch, an atomic scale memory device and an atomic scale logic circuit.

Other advantages of the present invention will become apparent from the following disclosure.

SUMMARY OF THE INVENTION

The present invention provides an electronic switch comprising (a) two fixed terminals spaced apart less than 100Å, (b) an atom switching element having at least two states and (c) means for reversibly changing the state of the switching element between a first state and a second state. Preferably, the electronic switch also comprises means for determining the state of the atom switching element. Generally, the first state has a different conductance condition between the terminals than the second state. Generally, the changing of the state of the atom switching element is effected by moving the atom switching element back and forth between the two fixed terminals. The present invention also relates to a memory device and to a logic circuit each comprising the elements of the electronic switch.

A more thorough disclosure of the present invention is presented in the detailed description which follows and from the accompanying drawing in which.

DESCRIPTION OF PREFERRED EMBODIMENTS

Figure 1:
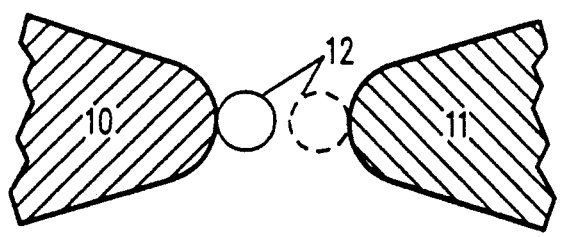
FIG. 1 is a schematic diagram to exaggerated scale of a two-terminal switch.

The present invention relates to an electronic switch comprising (a) a plurality of fixed terminals where at least two terminals are spaced apart less than 100Å, (b) an atom switching element positioned between said two terminals having at least two states, and (c) means for reversibly changing the state of the switching element between a first state and a second state. Preferably, the electronic switch also comprises means for determining the state of the atom switching element. Generally, the first state of the atom switching element has a different conductance condition between two fixed terminals than the second state.

The atom switching element as used herein shall mean one or more atoms or atom clusters or one or more molecules or molecular clusters which are non bonded or bonded together. An atom cluster generally comprises less than about 500 atoms which are bonded together by interatomic forces e.g. van der Waals. A molecular cluster comprises generally less than about 500 molecules and includes polymers generally having a molecular weight less than about 5000, preferably less than about 1000.

Generally, means for reversibly changing the state of the switching element from a first state to a second state will involve means for moving the switching element from a first position to a second position. Usually, at least one of the positions of the switching element is located between the spaced-apart terminals and generally both the first and second position of the switching element are located between the spaced-apart terminals. The terminals are fixed in space and in the preferred embodiment the terminals are spaced apart less than 50Å, preferably less than 25Å and more preferably less than 10Å. The movement of the switching element can be either (i) rotational movement with the switching element in the first position having a different orientation than the orientation in the second position or (ii) movement in the space where the first position is spaced apart from the second position. Generally, the switching element moves back and forth between the two spaced-apart terminals.

Alternatively, the means for changing state of the switching element is means for changing the electronic configuration of the switching element or changing the spin configuration of the electrons or the nucleus of the switching element.

Suitable means for changing the state of the switching element comprises generally means for applying a DC, AC or pulsed current or DC, AC or pulsed voltage to two or more of said plurality of terminals which will generally result in the movement of the switching element from a first position to a second position. Alternatively, the means for changing the state of the switching element can comprise mean for applying electromagnetic radiation or a magnetic field to the switching element.

The means for determining the state of the atom switch can be means for measuring conductance between the two spaced-apart terminals, means for detecting change in the optical properties of the atom switching element, e.g. the optical absorption, occurring with a change in state or means for detecting a change in the magnetic field or magnetic susceptibility of the atom switching element occurring with a change in state. Generally, a change in the state of the atom switching element will result in a change in conductance between the two space apart terminals and therefore a change in the state can generally be measured by a change in the conductance. The change in the conductance condition between the terminals may be generally measured by a change in the current between the terminals at some fixed bias voltage. In one embodiment of the present invention, the switch would have a first state a with a current between the two spaced apart terminals and a second state with no current between those two terminals. Alternatively, the amount of current between the two spaced apart terminals would merely vary with the change of the switching element between the two states. The change in conductance can also be represented by a change in the complex frequency dependent electrical conductance including both the real and imaginary part of such conductance such as change in capacitance, or dielectric constant.

Referring to FIG. 1, there is shown an atomic scale electronic switch in accordance with the present invention comprising two terminals 10, 11. An atom switching element 12 (here depicted as a single atom) is shown positioned between the terminals. In this example the state of the switch is determined by the position of the atom. By application of a current or voltage pulse of appropriate polarity and magnitude between the terminals 10, 11, the atom switching element 12 is caused to move from a first position between the terminals to a second position between the terminals, such as shown in broken lines. The conductance condition between the two terminals in the first position is different than the conductance condition between the terminals in the second position. By application of current or voltage pulses which is the reverse of that applied to the atom switching element 12 the atom can be caused to return to its original position and thus restore the switch to its initial state.

A suitable electronic switch is illustrated in Example 1. The switch comprises two terminals which are the conductive tip and surface of an STM which was used to demonstrate the switch of the present invention. Movement of a xenon atom back and forth between the surface and the tip of the STM causes a change in the conductance condition, between the switch terminals, the surface and the tip of the STM.

In an alternative embodiment where the atom switching element is nonsymmetric e.g. nonspherical, such as diatomic carbon monoxide, the orientation of the atom switching element between the terminals can be changed from a first orientation to a second orientation, to vary the conductance condition between two terminals. In this embodiment, the first and second position of the atom switching element are not spaced apart. Change in orientation can be effected by rotation or by changing the arrangement of the atoms in the molecule.

In another embodiment of the present invention, the switch can be fabricated on an insulating surface using an atomic force microscope ("AFM"). An AFM can be used to move atoms or molecules around on an insulating surface by moving the tip of an AFM to a position adjacent to the atom to be moved and subsequently increasing the attraction between the tip and atom by moving the tip closer to the surface. Then, while the atom remains bound to the surface, the tip can be moved laterally to drag the atom to a desired position on the surface. The tip can then be moved away from the surface, reducing the attraction between the atom and tip, and leaving the atom bound at the desired position. To make an electronic switch of the present invention on an insulating surface, enlarged terminals can be formed lithographically on an insulating surface by art known techniques so that their ends are spaced very close to each other. The AFM can then be used to move atoms on the insulating surface contiguous to each of the enlarged terminal ends to form the tip of the terminals of the switch. The AFM can then be used to position the atom switching element between the switch terminals. The operation of an AFM is known to those skilled in the art and is disclosed in U.S. Pat. No. 4,724,318, the disclosure of which is incorporated herein by reference.

An STM can also be utilized to fabricate an atomic switch on a thin insulating layer overlaying the conductive surface of the STM. The thickness of the insulating layer should be small enough to enable the passage of a tunneling current from the STM tip to the conductive surface. The procedure for forming the switch will generally be the same as that used in forming the switch with an AFM. The method of operating an STM is disclosed in U.S. Pat. No. 4,343,993, the disclosure of which is incorporated herein by reference. Other means for forming the electronic switch of the present invention will be known to those skilled in the art. The switches of the present invention can be utilized alone or a plurality of such switches can be used in parallel.

In another alternate embodiment the state of the switch may be controlled by an applied magnetic field. The active element can be an atom which possesses a magnetic moment and suitable crystalline anisotropy fields such as Gd. The anisotropy field at this atom can be such that the magnetic moment of the atom has two stable orientations (typically antiparallel to one another). An external magnetic field may be used to force the magnetic moment of the atom into a particular one of these two stable states. One or both of the terminals may be made from a half-metallic ferromagnet such as one of the Heusler alloys or chromium dioxide. The electrical conductivity from one terminal through the active atom and into the half-metallic ferromagnet will depend upon the orientation of the magnetization of the active element relative to the magnetization of the half-metallic ferromagnet. Thus the conductivity of the switch can be switched between states by application of a magnetic field.

In another alternate embodiment the magnetization or magnetic moment of the active element may be changed by application of an externally derived signal to the terminals of the switch. For example the terminals of a two terminal switch could be made from dissimilar materials such that the magnetic moment of an atom would be different according to which of the two terminals the atom was bound to. The atom may be moved from terminal to terminal in the manner already described thus switching the magnetic moment of the switch between two states.

In another alternate embodiment the optical properties of the switch may be toggled by application of a signal to the terminal of the switch. For example, application of a signal to the terminals may cause an atom or molecule to change its configuration and hence the frequency at which it absorbs light. It is well known in the art that absorption lines may be inhomogenously broadened. This results in the ability to do absorption spectroscopy on a single molecule. That molecule may have its absorption frequency shifted according to changes in the environment of the molecule. Application of an electrical signal to the terminals of the switch can cause the molecule to move or reorient. This results in the shifting of an absorption line which may then be detected by optical absorption techniques which are well known in the art.

Alternatively, the state of a switch may be controlled by shining light on the switch and then the state identified by the change in conductivity. For example, a molecule may be used as the active element of the switch. The electronic configuration of the molecule may be changed by absorption of a photon. The excited state of the molecule will in general result in a change in conductivity between the terminals of the switch.

Figure 2:
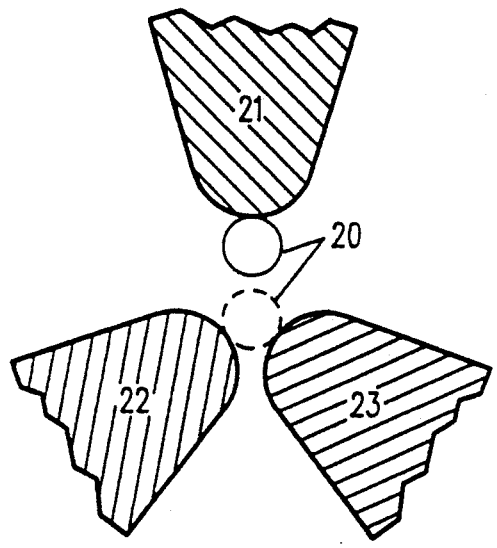
FIG. 2 is a schematic diagram to exaggerated scale of a three-terminal switch.

FIG. 2 illustrates a three-terminal electronic switch in which a switching element 20, is caused to transfer to a second position shown in broken lines thereby modifying the electrical conductance condition between the terminals 22, 23. This transfer may be affected, as in the case of the embodiment of FIG. 1, by applying a voltage or current pulse of appropriate polarity and magnitude between terminal 21, and either of the terminals 22, 23. By application of a reverse current or voltage pulse, the atom can be caused to return to its original position and thus restore the switch to its initial state.

The atom switching element 12 or 20 and associated terminals 10, 11 or 21, 22, 23 may be disposed on a common substrate. Alternatively, these atoms and terminals may be constituted by an arrangement of conducting lines that meet at a cavity in an insulating solid; and, in such case, the switching element would be contained in the cavity. Alternatively, the atom switching element may be a molecule. The controlling signal may be applied to the molecule by attaching suitable electrically conducting leads to the molecule, by sandwiching the molecule between two conducting layers, or by having the molecule span an insulating membrane such as a Langmuir-Blodgett film, on each side of which their is an electrically conducting solid or liquid.

In a preferred embodiment the switch is made from a molecule which inherently possesses a cavity, such as a zeolite or a fullerene. The switching element is contained in the cavity of this molecule. Application of an electrical signal across the molecule causes the switching element to change state resulting in a change in the properties of the molecule.

The switch of the present invention can function as a nonvolatile or volatile memory cell which may be used as a binary or multi-state module in a multi-bit computer memory.

Figure 3:
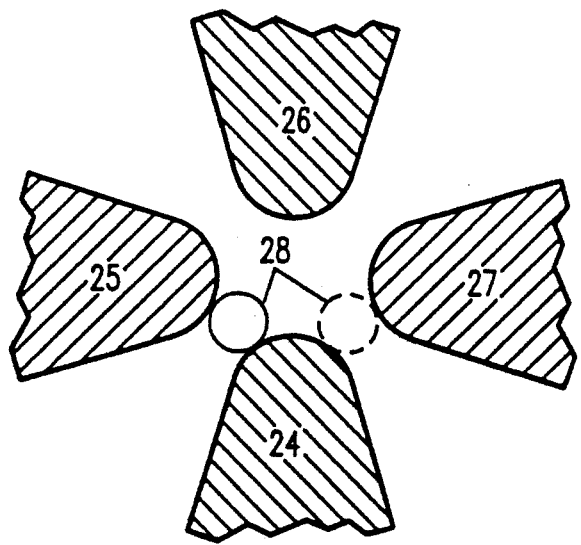
FIG. 3 is a schematic diagram of a multi-state memory device.

FIG. 3 depicts a multi-state memory having more than two states. It comprises four generally equally-spaced terminals 24, 25, 26, 27. When an atom switching element 28 (here depicted as an atom) is positioned, as shown, between terminals 24 and 25, a voltage pulse of appropriate magnitude and polarity can be applied between terminals 25 and 27. This will cause atom 28 to move to the position shown in broken lines and result in a change in conductance between terminals 25 and 24 and terminals 24 and 27.

If preferred, the terminals may be arranged in a three-dimensional configuration so long as the terminals are generally about equally spaced in such a manner that the tip of each terminal is generally the same distance from the tip of each of the other terminals.

The elements of the switch of the present invention can also function with associated wiring as a logic circuit such as an "inversion" circuit or a plurality of elements can function as an "or" circuit. Such circuits are well known to the art skilled and the use of the switch of the present invention as a logic circuit will be known to those skilled in the art.

The following example is a detailed description of a switch of the present invention. The detailed description falls within the scope of, and serves to exemplify, the more generally described switches set forth above. The example is presented for illustrative purposes only, and is not intended as a restriction on the scope of the invention.

EXAMPLE

Figure 4:
FIG. 4 is an STM image of Xenon atoms on a substrate.
Figure 5:
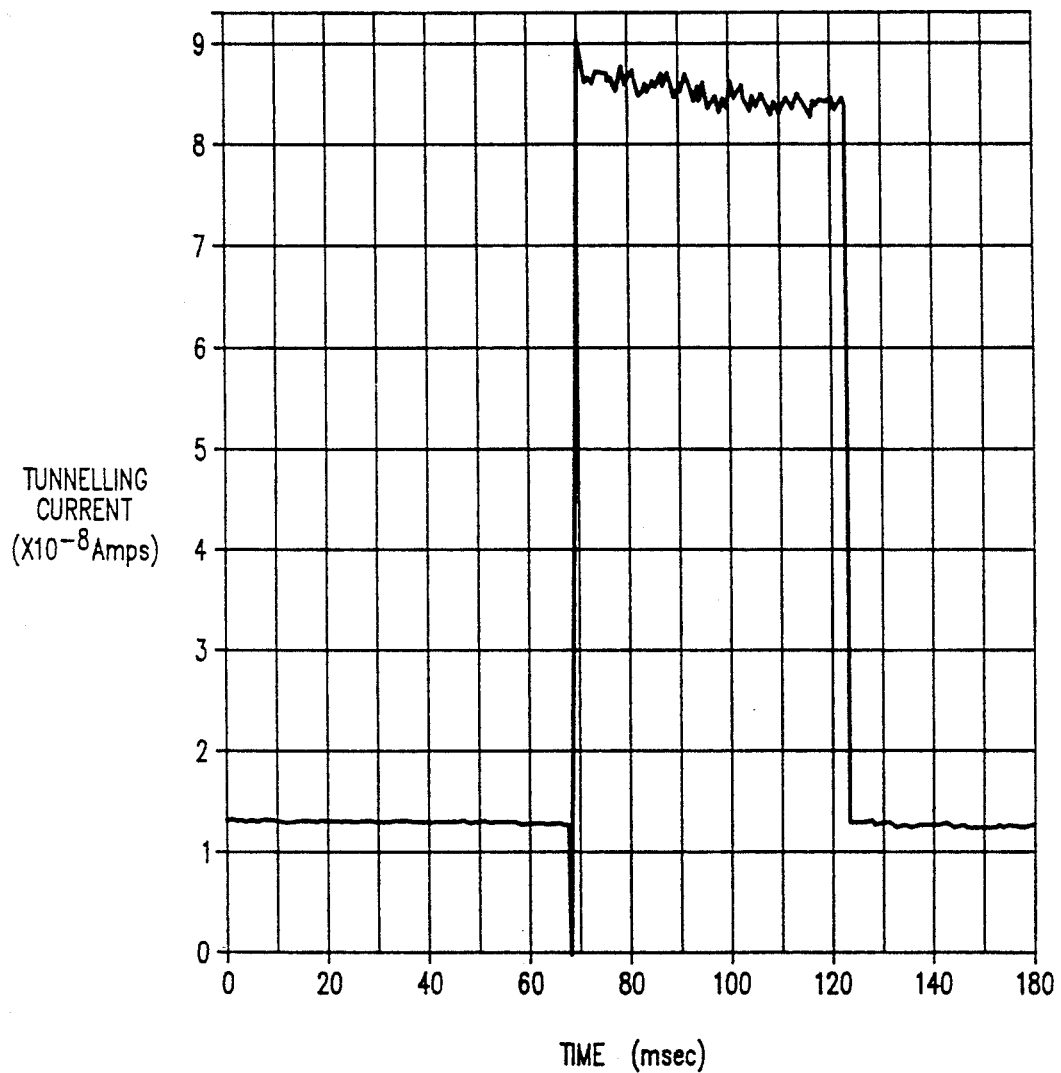
FIG. 5 is a graph of electrical current through a two terminal switch.
Figure 6:
FIGS. 6 and 7 are STM images of Xenon atoms on a substrate.
Figure 7:

An STM was placed into a chamber which was evacuated and cooled to 4K. The STM tip was made from polycrystalline tungsten and the stage was a (110) surface of a single crystal of nickel. The stage was dosed with Xenon atoms and the tip poked into the stage to yield high resolution. A Xe atom was moved into the kink of a monotonic step of the nickel surface and the tip positioned over the Xe atom at 5 angstrom above the height of the onset of the resistance plateau over the lower terrace of the kink. In this position the tunneling current resistance was 1.5 Mohm and the bias was $-0.02$ volts. FIG. 4 shows the Xe atom on the surface of the STM stage. The feedback loop was disconnected so that the position of the stage and tip were fixed. Referring to FIG. 5, the graph shows that with the Xe atom on the surface and the bias at $-0.02$ volts, the tunneling current was $1.3 \times 10^{-8}$ amps. A pulse of $+0.8$ volts was then applied to the tip for 64 m sec after which the bias was returned to $-0.02$ volts. FIG. 6 shows that the Xe atom was removed from the surface of the STM to the tip. In FIG. 5, the graph shows that the tunneling current after the pulse was about $9 \times 10^{-8}$ amps. The tip was then pulsed again, $-0.8$ volts for 64 msec. Referring to FIG. 7, the Xe atom was back on the surface of the STM and referring to FIG. 5, the tunneling current was again $1.3 \times 10^{-8}$ amps.

Although this invention has been described with respect to specific embodiments, the details thereof are not to be construed as limitations for it will be apparent that various embodiments, changes and modifications may be resorted to without departing from the spirit and scope thereof, and it is understood that such equivalent embodiments are intended to be included within the scope of this invention.

I claim:
1. An electronic switch comprising:
   (a) a plurality of terminals permanently fixed with respect to each other and spaced apart less than 100A;
   (b) an atom switching element having at least a first and a second state; and
   (c) means for moving said switching element back and forth between a first position and a second position to change the state of said atom switching element back and forth between said first state and said second state.

2. The switch of claim 1 wherein said switch further comprises means for determining the state of the atom switching element.

3. An electronic switch comprising:
(a) a plurality of terminals permanently fixed with respect to each other and spaced apart less than 100A;
(b) an atom switching element having at least a first and second state and
(c) means for moving said switching element back and forth between a first position and a second position to change the state of said atom switching element back and forth between said first state and said second state, said first state having a different conductance condition between said terminals than said second state.

4. The switch of claim 3 wherein said first position is on one of said terminals and said second position is on another of said terminals.

5. The switch of claim 4, wherein said means includes means for applying a voltage to effect movement of the atom switching element.

6. The switch of claim 4, wherein said means includes means for applying a current to effect movement of the atom switching element.

7. An electronic switch comprising
(a) a plurality of terminals permanently fixed with respect to each other and spaced apart less than 100A;
(b) an atom switching element between the terminals; and
(c) means for applying an electrical pulse of appropriate polarity and magnitude between selectable ones of said terminals for causing said switching element to move back and forth between said selectable terminals for correspondingly changing the switch from one state to another state.

8. A memory cell comprising:
(a) at least two terminals permanently fixed with respect to each other and spaced apart less than 100A;
(b) an atom switching element having at least a first and second state;
(c) means for determining the state of the atom switching element; and
(d) means for moving said switching element back and forth between a first position and a second position to change the state of said atom switching element back and forth between said first state and said second state.

9. A memory cell comprising
at least two terminals permanently fixed with respect to each other and spaced apart less than 100A,
(b) an atom switching element having at least a first and second state and
(c) means for moving said switching element back and forth between a first position and a second position to change the state of said atom switching element back and forth between said first state and said second state, said first state having a different conductance condition between said terminals than said second state.

10. The cell of claim 9 wherein said first position is on one of the said terminals and said second position is on the other of said terminals.

11. The cell of claim 10, wherein said means includes means for applying a voltage to effect movement of the atom switching elements.

12. The cell of claim 10, wherein said means includes means for applying a current to effect movement of the atom switching element.

13. A logic circuit comprising:
(a) at least two terminals permanently fixed with respect to each other and spaced apart less than 100A;
(b) an atom switching element having at least a first and a second state
(c) means for determining the state of the atom switching element; and
(d) means for moving said switching element back and forth between a first position and a second position to change the state of said atom switching element back and forth between said first state and said second state.

14. A logic circuit comprising:
(a) at least two terminals permanently fixed with respect to each other and spaced apart less than 100A;
(b) an atom switching element having at least a first and a second state and
(c) means for moving said switching element back and forth between a first position and a second position to change the state of said atom switching element back and forth between said first state and said second state, said first state having a different conductance condition between said terminals than said second state.

15. The circuit of claim 14 wherein said first position is on one of said terminals and said second position is on the other of said terminals.

16. The circuit of claim 15, wherein said means includes means for applying a voltage to effect movement of the atom switching element.

17. The circuit of claim 15, wherein said means includes means for applying a current to effect movement of the atom switching element.

* * * * *